(12) United States Patent
Chang et al.

(10) Patent No.: US 11,552,205 B2
(45) Date of Patent: Jan. 10, 2023

(54) OPTICAL SENSING DEVICE HAVING INCLINED REFLECTIVE SURFACE

(71) Applicant: Taiwan Semiconductor Manufacturing Company, Ltd., Hsinchu (TW)

(72) Inventors: Chih-Chiang Chang, Hsinchu (TW); Chia-Chan Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/096,961

(22) Filed: Nov. 13, 2020

(65) Prior Publication Data

US 2022/0158006 A1 May 19, 2022

(51) Int. Cl.
| | | |
|---|---|---|
| *H01L 31/101* | (2006.01) | |
| *H01L 31/0232* | (2014.01) | |
| *H01L 31/18* | (2006.01) | |
| *H01L 31/103* | (2006.01) | |
| *H01L 31/0352* | (2006.01) | |

(52) U.S. Cl.
CPC .......... *H01L 31/02327* (2013.01); *H01L 31/035281* (2013.01); *H01L 31/103* (2013.01); *H01L 31/1804* (2013.01)

(58) Field of Classification Search
CPC ..... H01L 27/148–14812; H01L 31/00–02327; H01L 31/10–103; H01L 27/146–14893
See application file for complete search history.

(56) References Cited

U.S. PATENT DOCUMENTS

| | | |
|---|---|---|
| 2006/0081890 A1 | 4/2006 | Kang |
| 2010/0155872 A1 | 6/2010 | Park |
| 2017/0236854 A1* | 8/2017 | Lee ............... H01L 27/1464 257/432 |

FOREIGN PATENT DOCUMENTS

| | | |
|---|---|---|
| CN | 1763964 | 4/2006 |
| CN | 101140904 | 3/2008 |
| DE | 102007042359 | 4/2008 |
| DE | 102018130470 | 3/2020 |
| KR | 20060034599 | 4/2006 |
| KR | 100949257 | 3/2010 |

OTHER PUBLICATIONS

"Office Action of German Counterpart Application," dated Jul. 7, 2021, p. 1-p. 6.
"Office Action of Taiwan Counterpart Application", dated Aug. 27, 2021, p. 1-p. 12.

\* cited by examiner

*Primary Examiner* — Suberr L Chi
(74) *Attorney, Agent, or Firm* — JCIPRNET

(57) ABSTRACT

Disclosed are devices for optical sensing and manufacturing method thereof. In one embodiment, a device for optical sensing includes a substrate, a photodetector and a reflector. The photodetector is disposed in the substrate. The reflector is disposed in the substrate and spaced apart from the photodetector, wherein the reflector has a reflective surface inclined relative to the photodetector that reflects light transmitted thereto to the photodetector.

20 Claims, 11 Drawing Sheets

OPTICAL SENSING DEVICE HAVING INCLINED REFLECTIVE SURFACE

BACKGROUND

Optical gratings are frequently used to enable light to be directed to photodetectors. However, the optical gratings occupies a large area, and the interval of the optical gratings will affect the transmission waveband.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
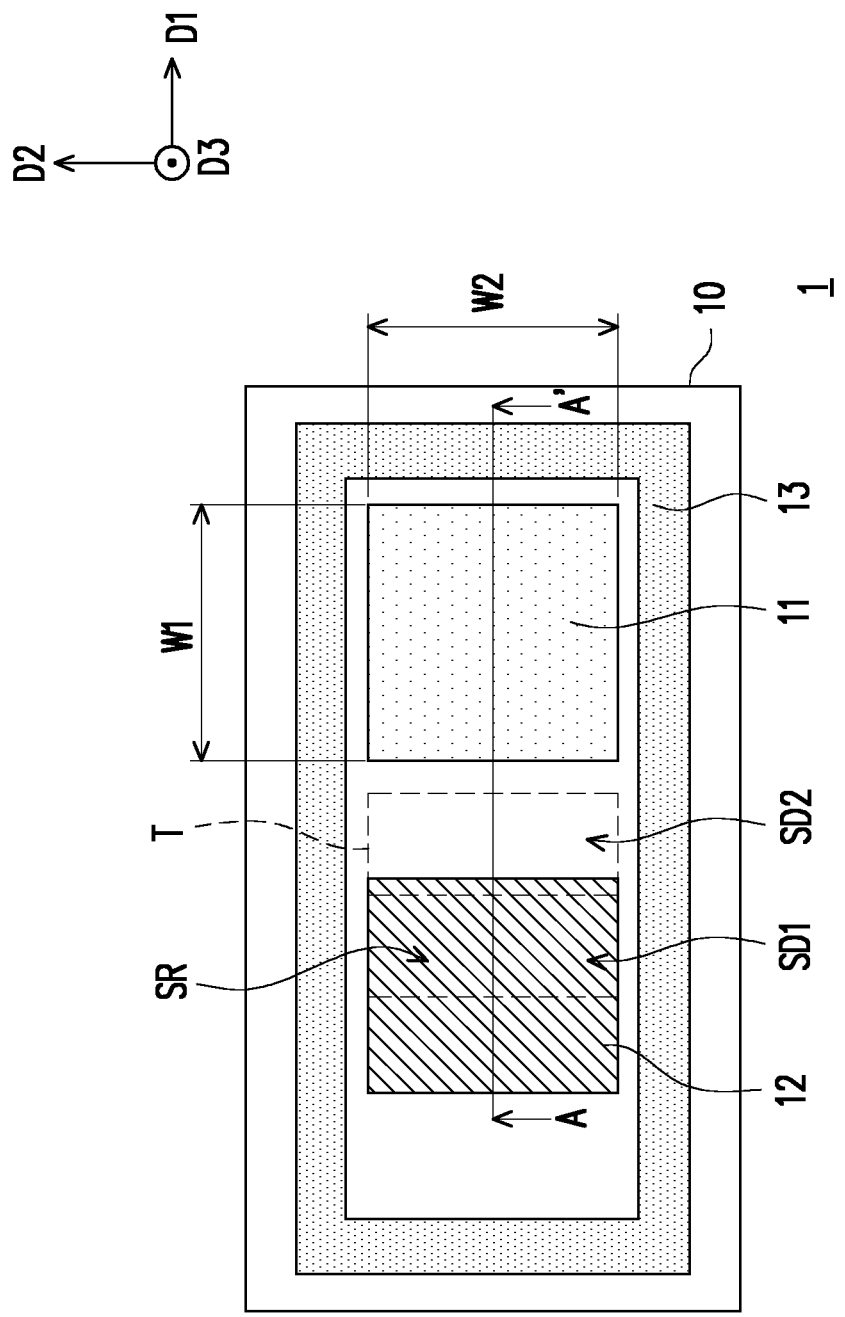
FIG. 1 illustrates a partial top view of an exemplary device for optical sensing, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, it will be understood that when an element is referred to as being "connected to" or "coupled to" another element, it may be directly connected to or coupled to the other element, or one or more intervening elements may be present. Further, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
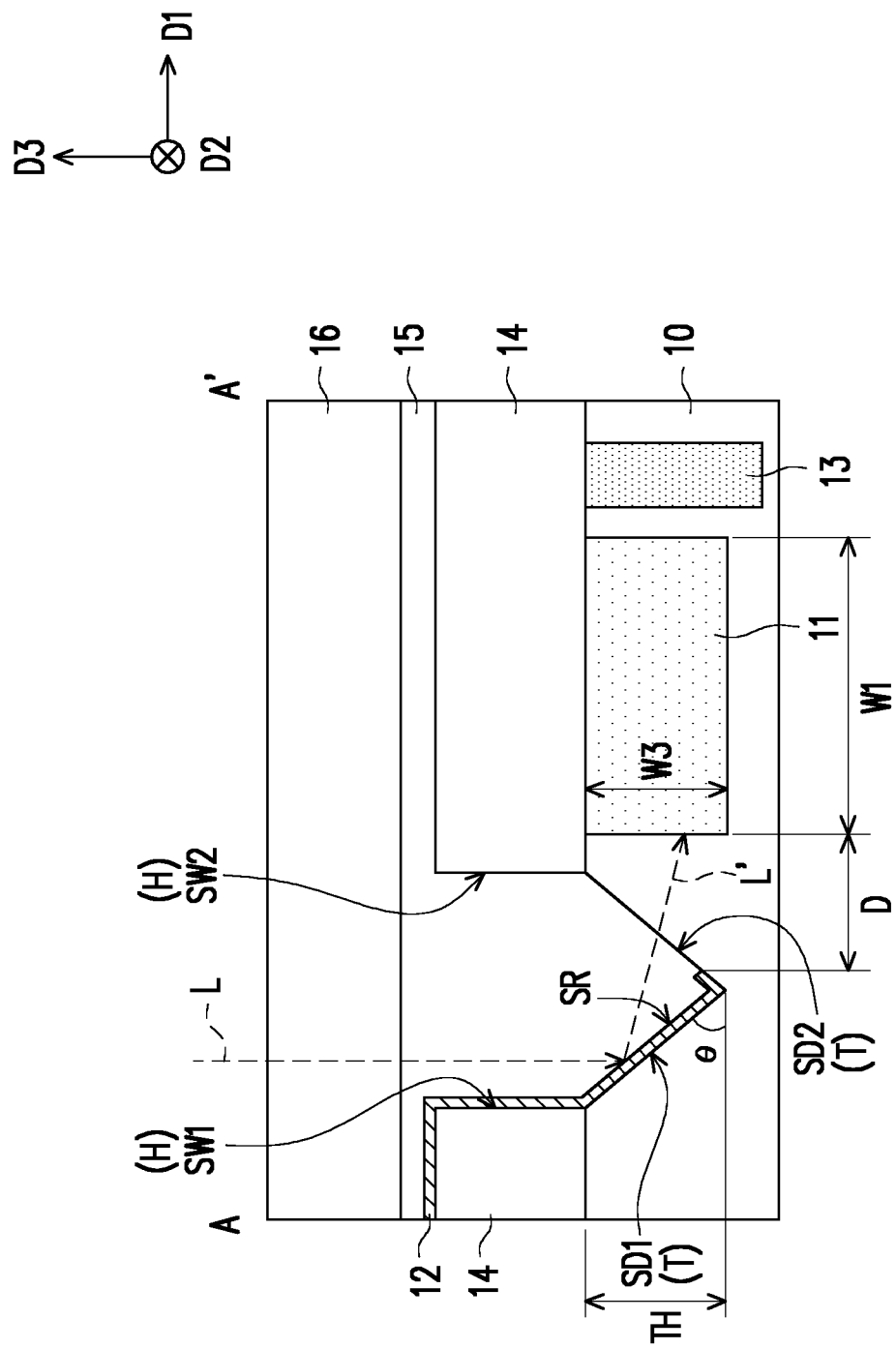
FIG. 2 illustrates a cross-sectional view of the device for optical sensing along line A-A' in FIG. 1.

FIG. 1 illustrates a partial top view of an exemplary device 1 for optical sensing, in accordance with some embodiments of the present disclosure. FIG. 2 illustrates a cross-sectional view of the device 1 for optical sensing along line A-A' in FIG. 1. For simplicity, part of the layers or elements are shown in FIG. 2 but omitted in FIG. 1. It is noted that the device 1 for optical sensing is merely an example, and is not intended to limit the present disclosure. Accordingly, it is understood that additional layers or elements may be provided in or coupled to the device 1 for optical sensing of FIG. 1 and FIG. 2, and that some other layers or elements may only be briefly described herein.

Referring to FIG. 1 and FIG. 2, the device 1 for optical sensing includes a substrate 10, a photodetector 11 and a reflector 12, in accordance with some embodiments of the present disclosure.

The substrate 10 may be a semiconductor substrate. In some embodiments, materials of the substrate 10 include silicon (Si), or silicon germanium (SiGe). However, other suitable materials are within the contemplated scope of the disclosure.

The photodetector 11 is disposed in the substrate 10. In some embodiments, the photodetector 11 is a photodiode, and the photodetector 11 is formed in the substrate 10 by introducing n-type or p-type implants into the substrate 10 to form n-type region or p-type region. However, other suitable types of photodetectors are within the contemplated scope of the disclosure.

In some embodiments, additional layers or elements may be provided in the substrate 10. For example, the device 1 for optical sensing may further include an isolation element 13 disposed in the substrate 10, but not limited thereto. In some embodiments, the isolation element 13 surrounds the photodetector 11 and the reflector 12, as shown in FIG. 1. In some embodiments, materials of the isolation element 13 include oxide, metal, or air. However, other suitable materials are within the contemplated scope of the disclosure. In some embodiments, the isolation element 13 is formed in the substrate 10 by photolithography and etching processes. However, other suitable manufacturing methods are within the contemplated scope of the disclosure.

The reflector 12 is disposed in the substrate 10 and spaced apart from the photodetector 11, wherein the reflector 12 has a reflective surface SR inclined relative to the photodetector 11 that reflects light L transmitted thereto (light L transmitted to the reflective surface SR) to the photodetector 11. In other words, the reflective surface SR is a surface of the reflector 12 that reflect light L from the outside toward the photodetector 11. Materials of the reflector 12 may include metal, alloy, or combination thereof. In some embodiments, spectral reflectivity of the reflector 12 at wavelength less than 800 nm is larger than or equal to 0.4, and the spectral reflectivity of the reflector 12 at wavelength greater than or equal to 800 nm is larger than or equal to 0.6. For example, materials of the reflector 12 include aluminum (Al), aluminum copper (AlCu), silver (Ag), tungsten (W), or cobalt (Co). However, other suitable materials are within the contemplated scope of the disclosure.

Figure 4:
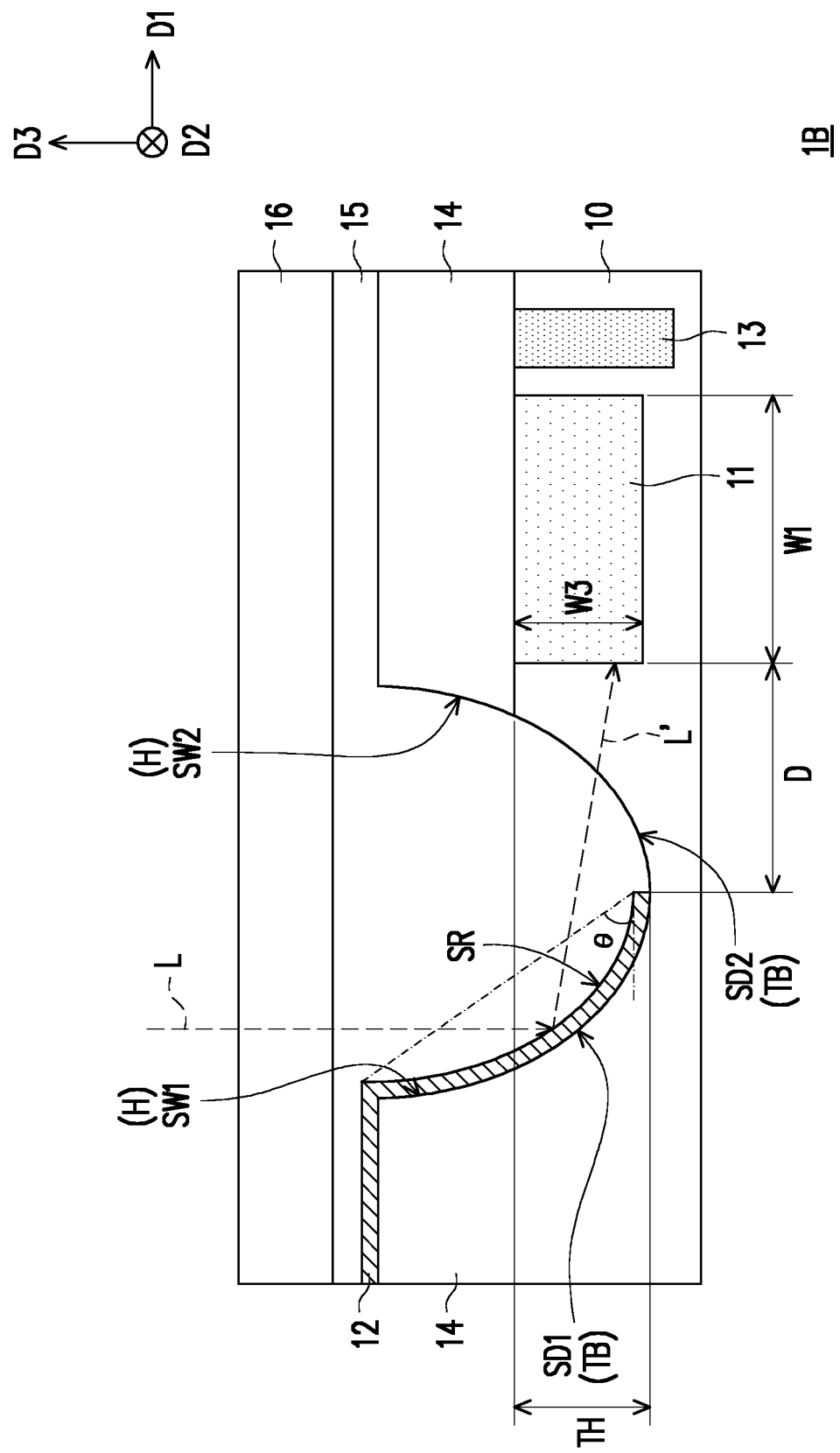
FIG. 4 illustrates a partial top view of another exemplary device for optical sensing, in accordance with some embodiments of the present disclosure.

In some embodiments, the substrate 10 includes a trench T spaced apart from the photodetector 11 to dispose the reflector 12. In some embodiments, the trench is V-shaped (as shown in FIG. 2) or U-shaped (as shown in FIG. 4). However, other shapes are within the contemplated scope of the disclosure.

The trench T has a first side SD1 and a second side SD2 opposite to the first side SD1. In some embodiments, the photodetector 11 is next to the second side SD2, and the second side SD2 is located between the first side SD1 and the photodetector 11. Specifically, a half side (or a half sidewall) of the trench T that is closer to the photodetector 11 is the second side SD2 of the trench T, and the other half side (or the other half sidewall) of the trench T is the first side SD1 of the trench T. In this way, an arrangement direction (e.g., a direction D1) of the first side SD1, the second side SD2 and the photodetector 11 is perpendicular to a thickness direction (e.g., a direction D3) of the photodetector 11.

In some embodiments, the reflector 12 is disposed on the first side SD1 of the trench T, and the reflective surface SR faces the second side SD2. Since the reflector 12 exposes at least a portion of the second side SD2 of the trench T, light L' reflected by the reflective surface SR can pass through the partial second side SD2 of the trench T and then received by the photodetector 11. In other words, at least a portion of the reflector 12 is disposed outside of the transmission path of the light L' reflected by the reflective surface SR. Therefore, at least a portion of the light L' reflected by the reflective surface SR can be transmitted to the photodetector 11 without being blocked by the reflector 12. In some embodiments, the reflector 12 can be further disposed on a portion (e.g., a bottom portion) of the second side SD2 and exposes the other portion (e.g., a top portion) of the second side SD2 of the trench T. The length of the reflector 12 disposed on the second side SD2 can be controlled according to design requirements (e.g., the incident angle, incident range, or incident position of the light L' at the photodetector 11). In some alternative embodiments, the reflector 12 is disposed on the first side SD1 of the trench T and not disposed on the second side SD2 of the trench T.

In some embodiments, the first side SD1 and the second side SD2 of the trench T both include inclined surfaces. In some embodiments, an inclination direction of the second side SD2 is different from an inclination direction of the first side SD1. In some embodiments, an inclination angle of the second side SD2 differs from or equals to an inclination angle of the first side SD1. In some embodiments, an inclination angle θ of the reflective surface SR is equal to or approximate to the inclination angle of the first side SD1. In some embodiments, the inclination angle θ of the reflective surface SR satisfies:

$$\tan(2\theta - 90°) \le \frac{TH}{TH \times \cot\theta + 2D}$$

wherein TH is a thickness of the reflector 12 in the substrate 10, and D is a distance between the photodetector 11 and the reflector 12. For example, the thickness TH refers to the minimum depth of the reflector 12 in the substrate 10 along the direction D3, and the distance D refers to a minimum distance between the photodetector 11 and the reflector 12 along the direction D1.

In some embodiments, the reflector 12 is close to the photodetector 11. For example, the distance D between the photodetector 11 and the reflector 12 satisfies:

$$D \le W1$$

wherein W1 is a width of the photodetector along the arrangement direction (e.g., the direction D1) of the photodetector 11 and the reflector 12.

In some embodiments, an area AR of the reflective surface SR satisfies:

$$AR \ge \frac{1}{2}(W2 \times W3)$$

wherein W2 is a width of the photodetector 11 along a direction D2 perpendicular to a thickness direction (e.g., the direction D3) of the photodetector 11 and an arrangement direction (e.g., the direction D1) of the photodetector 11 and the reflector 12, and W3 is a width of the photodetector 11 along the thickness direction (e.g., the direction D3) of the photodetector 11.

In some embodiments, the device 1 for optical sensing further includes a first dielectric layer 14, a second dielectric layer 15, and a third dielectric layer 16. However, any number of the dielectric layers in the device 1 for optical sensing are within the contemplated scope of the disclosure.

The first dielectric layer 14 is disposed on the substrate 10 and covers the photodetector 11 and the isolation element 13. In some embodiments, materials of the first dielectric layer 14 include oxide, silicon oxynitride, silicon nitride, or combination of at least two of the above. In other words, the first dielectric layer 14 can be a single layer or multiple layers.

The first dielectric layer 14 includes a through hole H connected to the trench T. In some embodiments, the reflector 12 extends onto the first dielectric layer 14 along a partial sidewall (e.g., sidewall SW1) of the through hole H. As shown in FIG. 2, the reflector 12 may cover the sidewall SW1 of the through hole H and not cover sidewall SW2 of the through hole H.

The second dielectric layer 15 is disposed on the reflector 12 and the first dielectric layer 14. Further, the second dielectric layer 15 may be filled in the trench T and the through hole H. In some embodiments, materials of the second dielectric layer 15 include oxide, silicon oxynitride, silicon nitride, or combination of at least two of the above. In other words, the second dielectric layer 15 can be a single layer or multiple layers. Moreover, the materials of the second dielectric layer 15 may be the same as or different from the materials of the first dielectric layer 14. In some embodiments, materials of the second dielectric layer 15 include light converging materials, such as silicon oxynitride, silicon nitride, or other suitable materials, so that light L may be converged on the reflective surface SR of the reflector 12.

The third dielectric layer 16 is disposed on the second dielectric layer 15. In some embodiments, materials of the third dielectric layer 16 include oxide, silicon oxynitride, silicon nitride, or combination of at least two of the above. In other words, the third dielectric layer 16 can be a single layer or multiple layers. Moreover, the materials of the third dielectric layer 16 may be the same as or different from the materials of the first dielectric layer 14 and/or the second dielectric layer 15. In some alternative embodiments, the third dielectric layer 16 may be omitted.

In the device 1 for optical sensing, although not shown, a plurality of photodetectors 11 and a plurality of reflectors 12 may be included. The plurality of photodetectors 11 and the plurality of reflectors 12 may be arranged in an array. For example, one photodetector 11 and one reflector 12 can form a sensing unit, and a plurality of sensing units formed from the plurality of photodetectors 11 and the plurality of reflectors 12 may be arranged in an array. It is noted that any number of photodetectors 11 and any number of reflectors 12 can form a sensing unit.

Although not shown, the device 1 for optical sensing may further include other elements or layers according to needs.

For example, the device 1 for optical sensing may further include a collimator disposed on the third dielectric layer 16 to collimate the light L. The collimator may include a micro lens array, but not limited thereto. Any type of light collimating elements are within the contemplated scope of the disclosure. The micro lens array may include a plurality of micro lenses arranged corresponding to the plurality of sensing units.

In some embodiments, although not shown, the device 1 for optical sensing may further include a color filter layer disposed between the third dielectric layer 16 and the collimator. The color filter layer may include a plurality of color filter structures arranged corresponding to the plurality of sensing units.

In some embodiments, although not shown, the device 1 for optical sensing may further include a plurality of wiring layers for signal transmission. In some embodiments, the plurality of wiring layers are stacked between the third dielectric layer 16 and the color filter layer. In some alternative embodiments, the plurality of wiring layers are stacked on the backside of the plurality of sensing units. In this way, the plurality of photodetectors 11 and the plurality of reflectors 12 are located between the plurality of wiring layers and the color filter layer. Additional layers or elements may be provided in the device 1 for optical sensing, and will be not repeated in the embodiments of the disclosure.

In the device 1 for optical sensing, the light L outside the device 1 for optical sensing can be directed to the photodetector 11 by the reflector 12; therefore, optical gratings are not required. The reflector 12 is easy to process with mature CMOS image sensor (CIS) process. Moreover, the reflector 12 occupies smaller area than the optical gratings. Furthermore, the reflector 12 can reflect light of various wavebands. Therefore, size or volume of the device 1 for optical sensing may be reduced, and the device 1 for optical sensing may have no wavelength limitation or broader applications, such as various types of monitors, face or fingerprint recognition devices, but not limited thereto. In addition, the device 1 for optical sensing can be used with or without an optical fiber (not shown). With the help of the reflector 12, the placement angle of an optical fiber is less limited. The placement angle of the optical fiber refers to an angle between an axis of the optical fiber and the direction D3. The placement angle of the optical fiber may be modified to improve the amount of the light L' received by the photodetector 11.

Figure 3A:
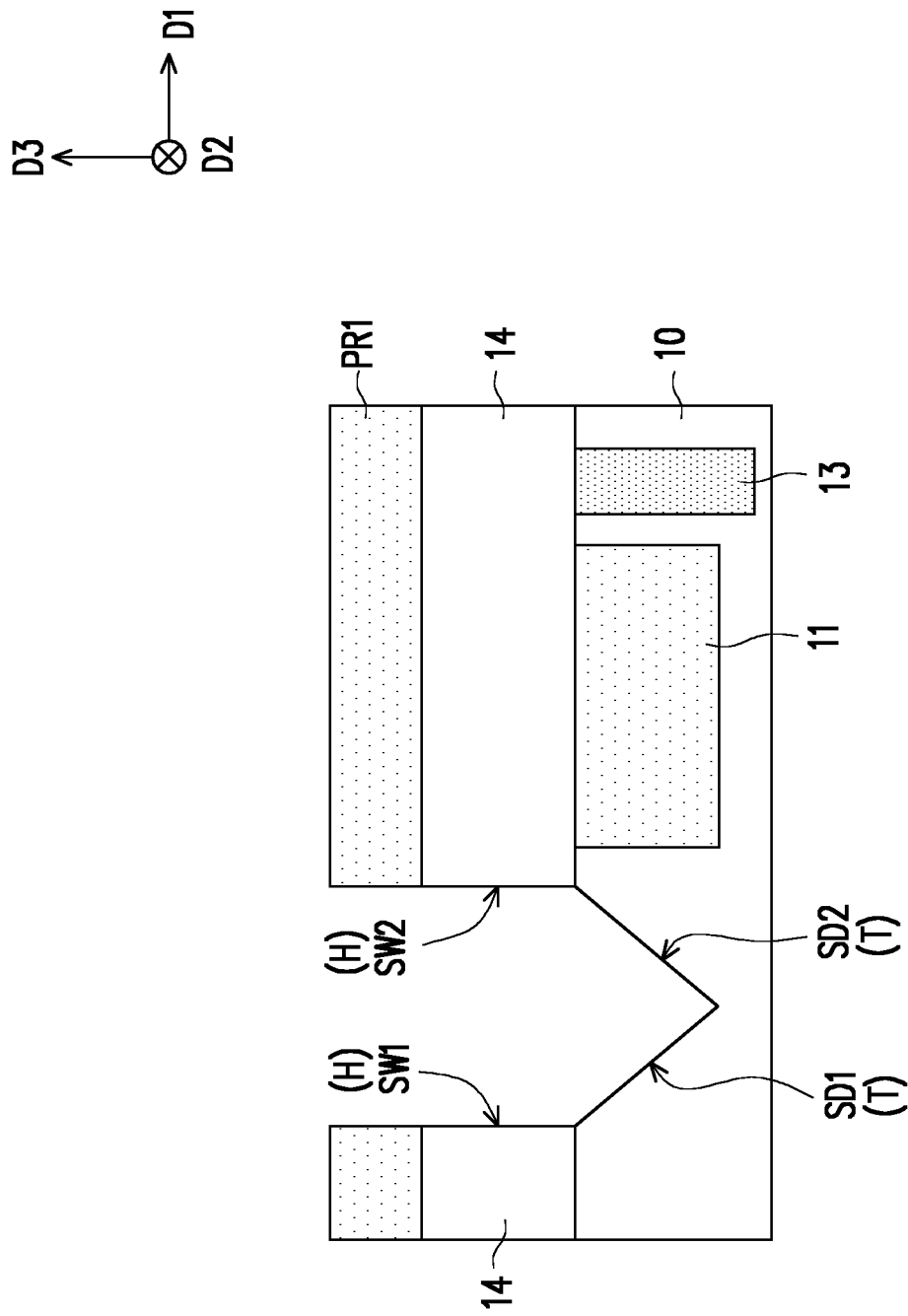
FIG. 3A to FIG. 3D illustrate partial cross-sectional views of a manufacturing method of a device for optical sensing, in accordance with some embodiments of the present disclosure.

FIG. 3A to FIG. 3D illustrate partial cross-sectional views of a manufacturing method of a device 1A for optical sensing, in accordance with some embodiments of the present disclosure. Referring to FIG. 3A, the photodetector 11 is formed in the substrate 10, the method of forming the photodetector 11 in the substrate 10 can refer to the above, and thus will not be repeated here. In some embodiments, as shown in FIG. 3A, the isolation element 13 is also formed in the substrate 10, the method of forming the isolation element 13 in the substrate 10 can refer to the above, and thus will not be repeated here. The photodetector 11 may be formed prior to the isolation element 13. Alternatively, the isolation element 13 may be formed prior to the photodetector 11.

In some embodiments, as shown in FIG. 3A, the first dielectric layer 14 is formed on the substrate 10. Then, a patterning process is performed on the first dielectric layer 14 and the substrate 10 to form the trench T in the substrate 10 as well as the through hole H in the first dielectric layer 14. In the case where a large area of the substrate 10 is removed by the patterning process, the V-shaped trench T is formed in the substrate 10 due to the crystal lattice direction of the substrate 10.

The patterning process may include forming a patterned photoresist layer PR1 on the first dielectric layer 14 by a photolithography process; and removing the first dielectric layer 14 exposed by the patterned photoresist layer PR1 and a portion of the substrate 10 under the removed first dielectric layer 14 by an etching process. In other words, in the embodiments of the V-shaped trench T, the trench T and the through hole H may be formed by one etching step. However, multiple etching steps are within the contemplated scope of the disclosure.

Figure 3B:
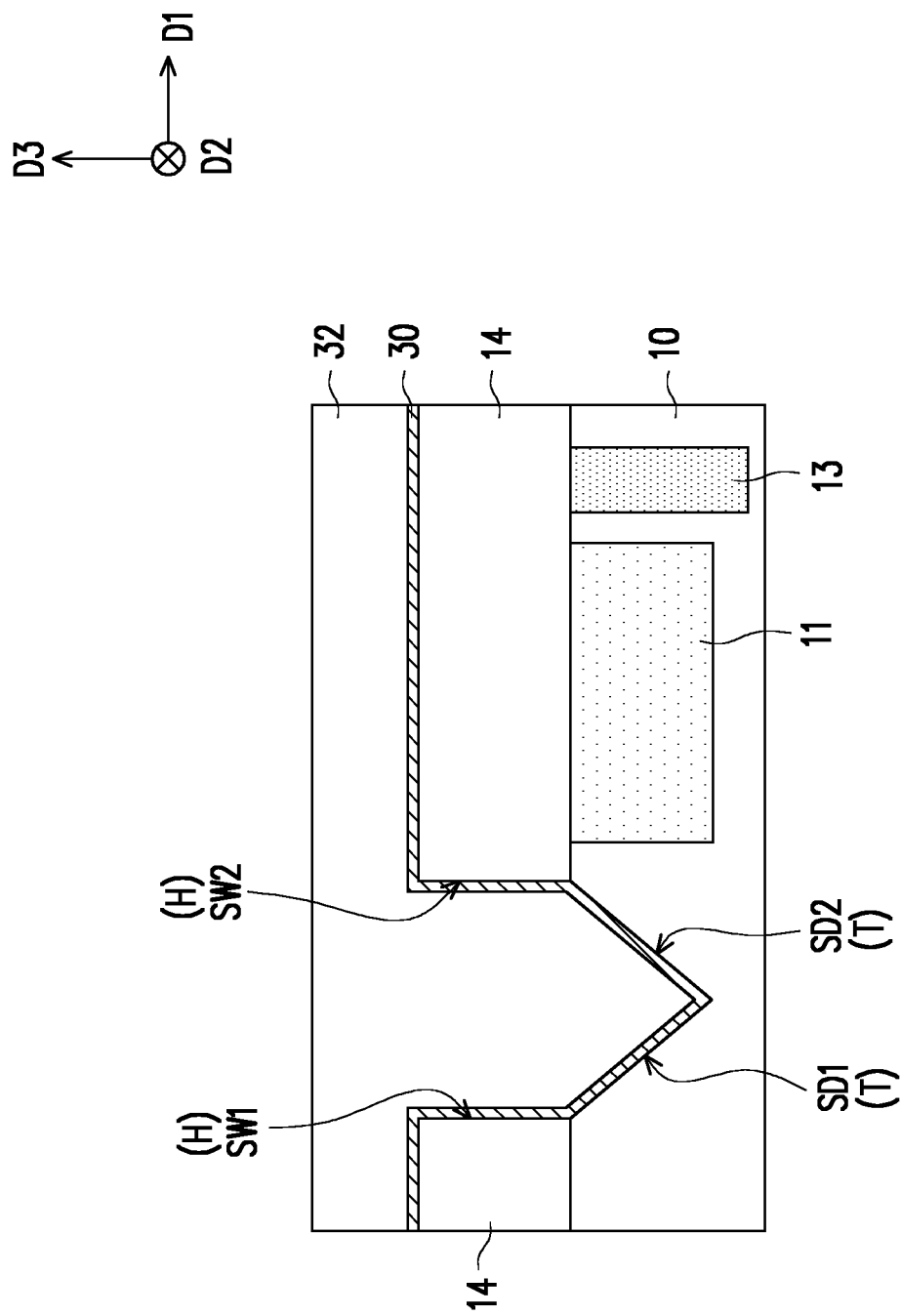

Referring to FIG. 3B, the patterned photoresist layer PR1 is removed. Moreover, a reflective layer 30 that covers the trench T, sidewalls (including the sidewall SW1 and the sidewall SW2) of the through hole H, and the first dielectric layer 14 is formed. Materials of the reflective layer 30 can refer to the materials of the reflector 12 described above, and thus will not be repeated here.

Furthermore, a dielectric layer 32 that covers the reflective layer 30 is formed. Materials of the dielectric layer 32 can refer to the materials of the second dielectric layer 15 described above, and thus will not be repeated here.

Figure 3C:
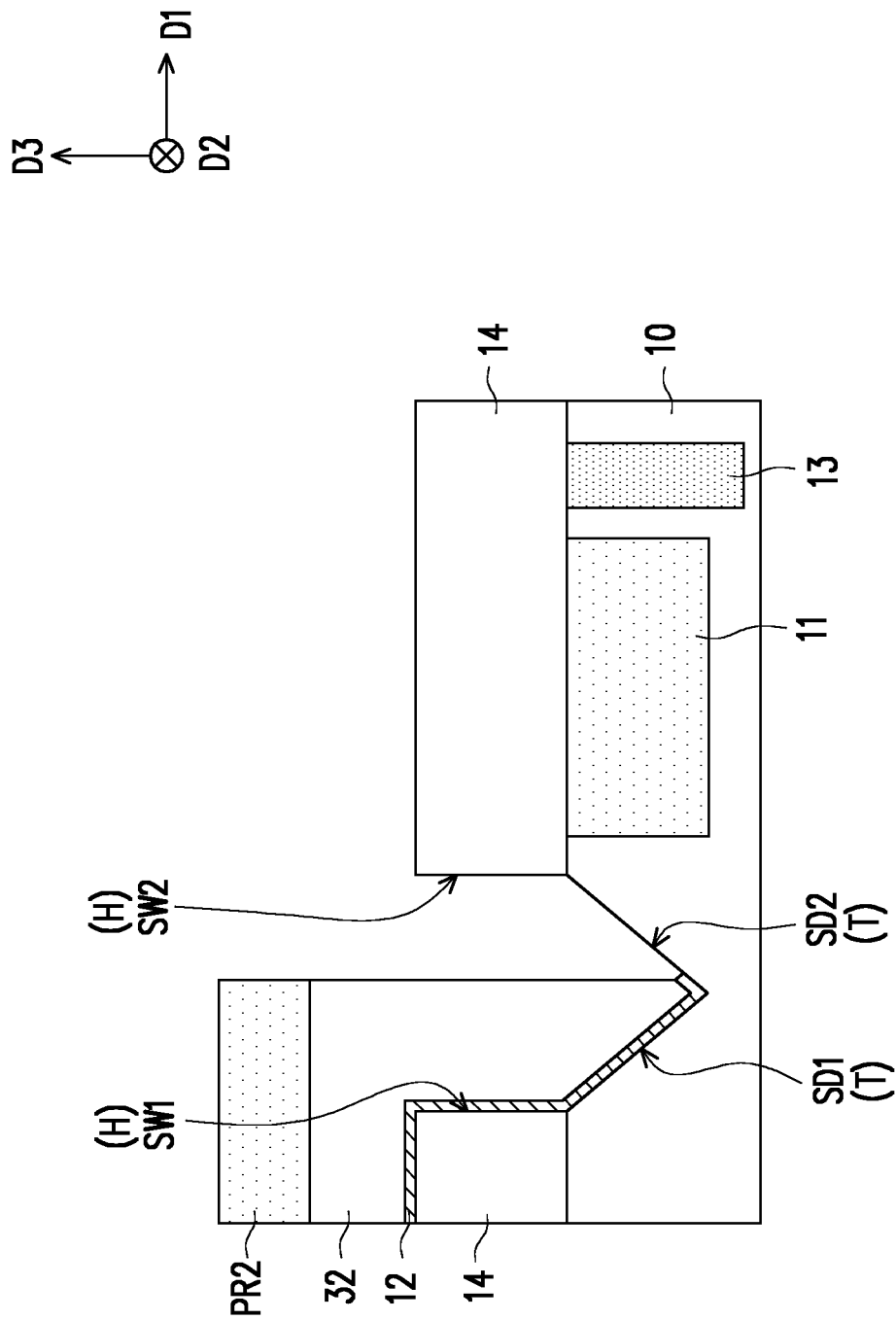

Referring to FIG. 3C, the dielectric layer 32 and the reflective layer 30 are patterned to form the reflector 12. The patterning process may include forming a patterned photoresist layer PR2 on the dielectric layer 32 by a photolithography process; and removing the dielectric layer 32 exposed by the patterned photoresist layer PR2 and a portion of the reflective layer 30 under the removed dielectric layer 32 by an etching process.

Figure 3D:
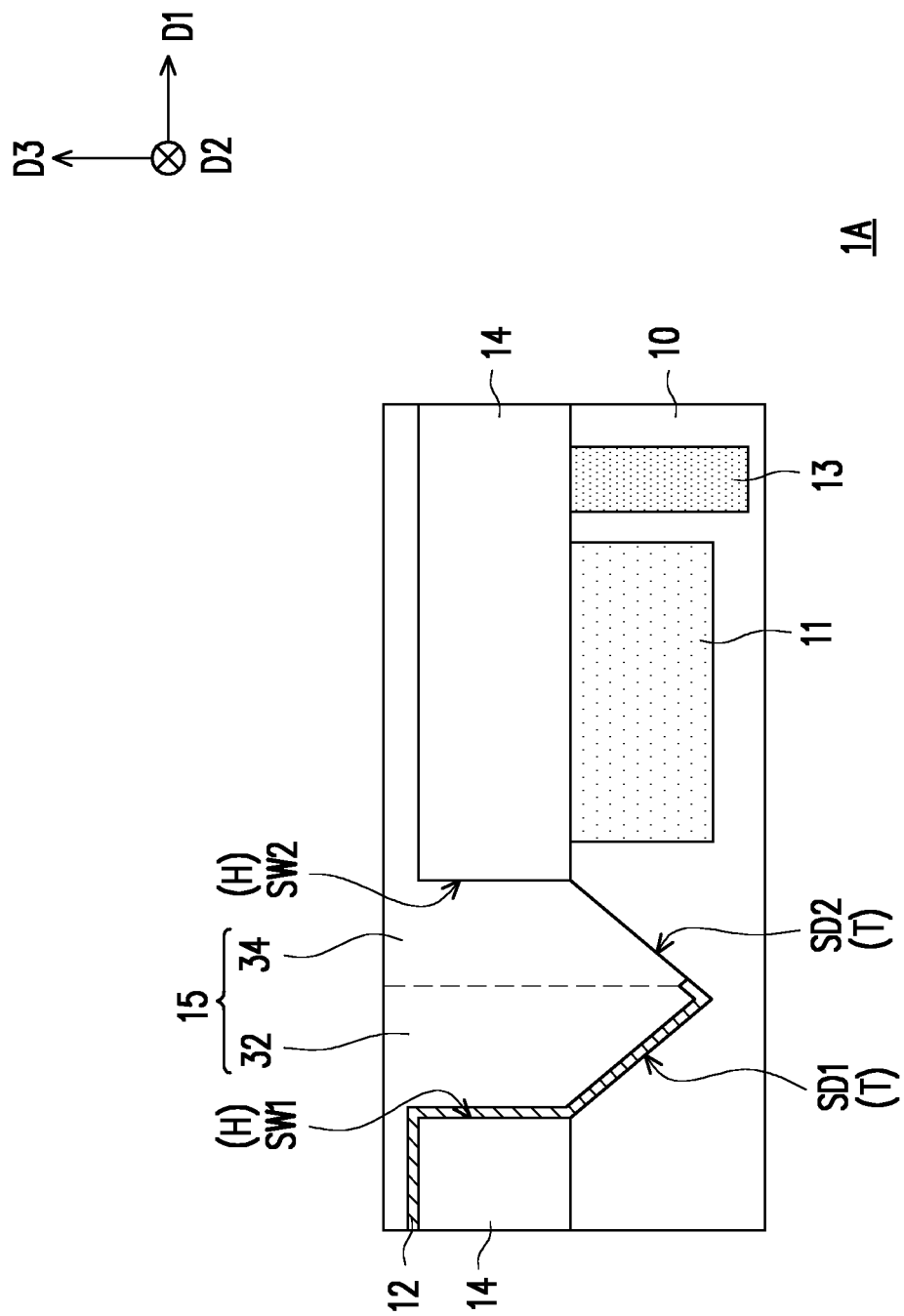

Referring to FIG. 3D, another dielectric layer 34 that covers the substrate 10 and the first dielectric layer 14 that are exposed by the reflector 12 is formed. Materials of the another dielectric layer 34 can refer to the materials of the second dielectric layer 15 described above, and thus will not be repeated here. In some embodiments, the materials of the dielectric layer 32 and the another dielectric layer 34 are the same. However, the materials of the dielectric layer 32 and the another dielectric layer 34 may be different.

Then, the dielectric layer 32 and the another dielectric layer 34 are thinned by a grinding process (e.g., a chemical-mechanical planarization process, but not limited thereto) to form the second dielectric layer 15.

In some alternative embodiments, other layers or elements (e.g., the third dielectric layer 16 in FIG. 2, or the layers or elements described above) may be further formed on the second dielectric layer 15.

FIG. 4 illustrates a partial top view of another exemplary device 1B for optical sensing, in accordance with some embodiments of the present disclosure. Referring to FIG. 4, the main difference between the device 1B for optical sensing and the device 1 for optical sensing in FIG. 2 is that the trench TB in the substrate 10 is U-shaped. The first side SD1 and the second side SD2 of the U-shaped trench TB both include curved surfaces that are inclined relative to the photodetector 11. The inclination angle θ of the reflective surface SR refers to an acute angle between the direction D1 and a line from the highest point to the lowest point of the reflector 12 on the first side SD1.

FIG. 5A to FIG. 5H illustrate partial cross-sectional views of another manufacturing method of a device 1C for optical sensing, in accordance with some embodiments of the present disclosure. Specifically, FIG. 5A to FIG. 5H shows the method to manufacture the U-shaped trench TB. For simplicity, the device 1C for optical sensing in FIG. 5H does not show the photodetector 11 and the isolation element 13 in FIG. 4. However, it is understood that additional layers or elements may be provided in or coupled to the device 1C for optical sensing of FIG. 5H, and that some other layers or elements may only be briefly described herein.

Figure 5A:
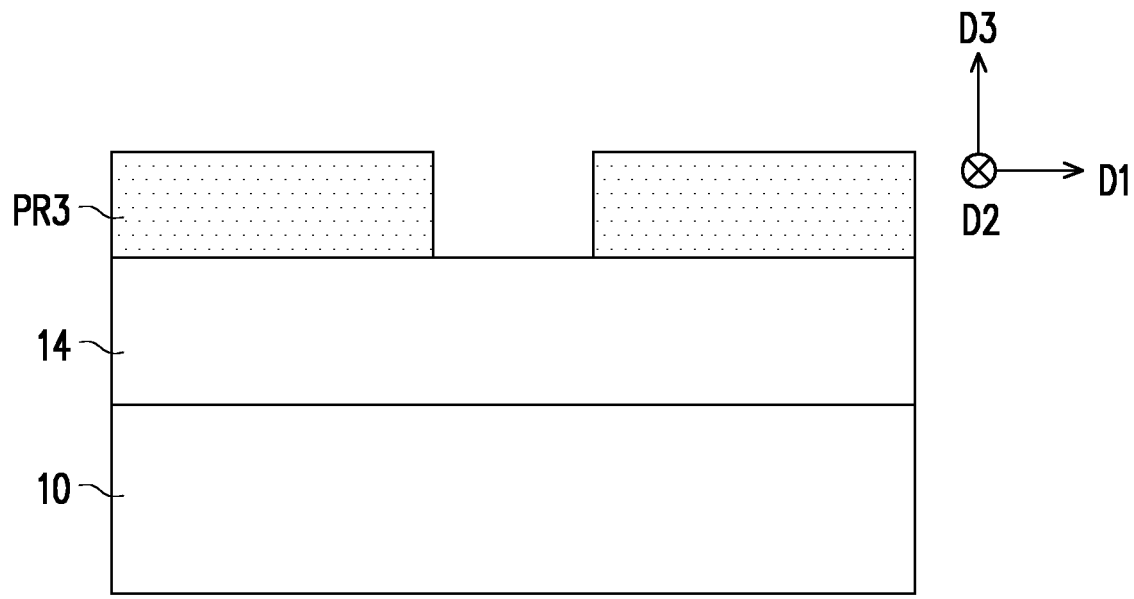
FIG. 5A to FIG. 5H illustrate partial cross-sectional views of another manufacturing method of a device for optical sensing, in accordance with some embodiments of the present disclosure.
Figure 5B:
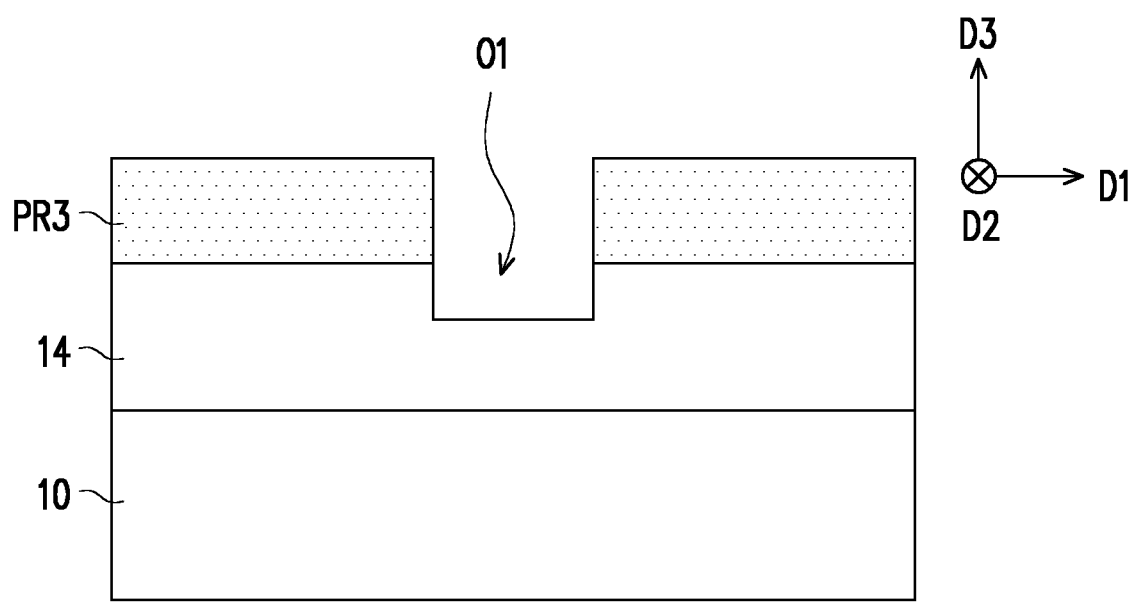

Referring to FIG. 5A and FIG. 5B, a patterning process is performed on the first dielectric layer 14 to form an opening O1 on the first dielectric layer 14. The patterning process may include forming a patterned photoresist layer PR3 on the first dielectric layer 14 by a photolithography process; and removing a portion of the first dielectric layer 14 exposed by the patterned photoresist layer PR3 by an etching process.

Figure 5C:
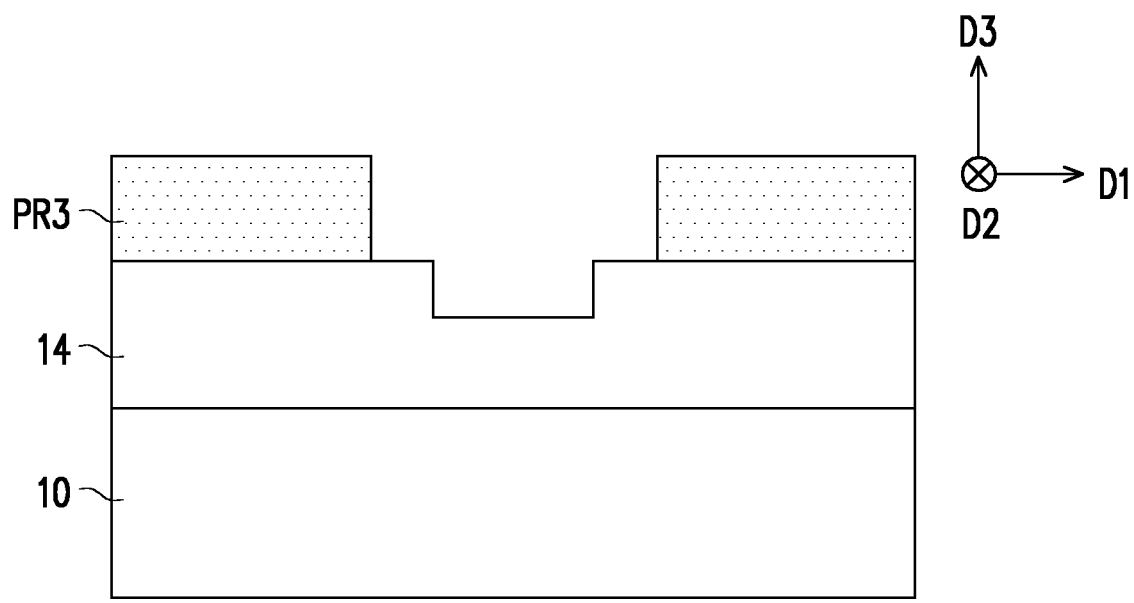
Figure 5D:
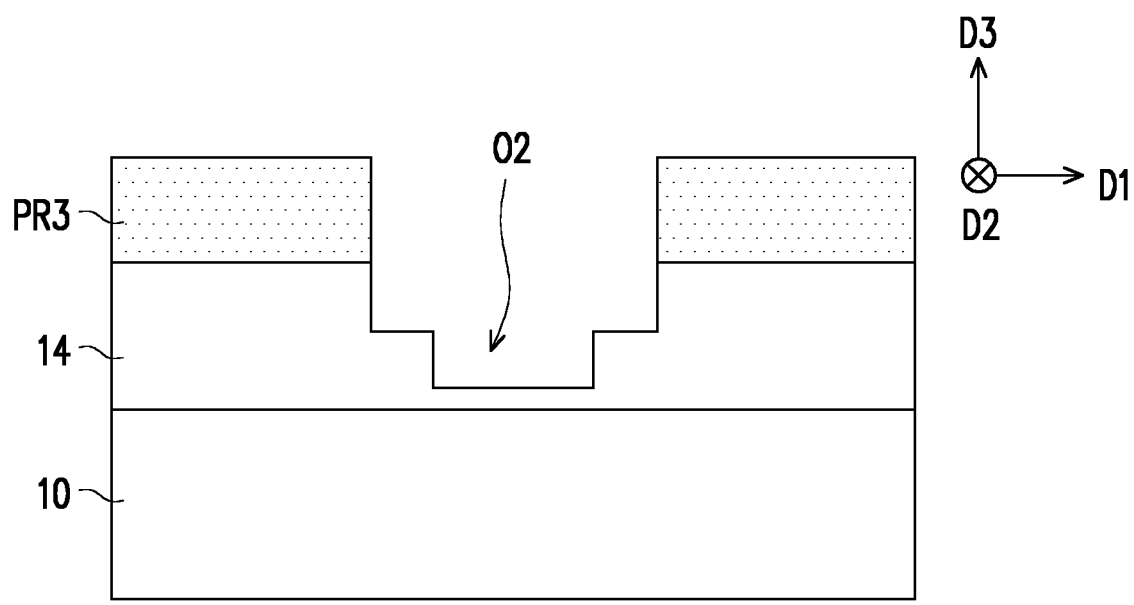

Referring to FIG. 5C and FIG. 5D, the patterned photoresist layer PR3 is trimmed to expose a larger area of the first dielectric layer 14. Then, another etching process is performed to form another opening O2 on the first dielectric layer 14. The opening O2 is wider and deeper than the opening O1. Moreover, the opening O2 is, for example, a T-shaped opening with a wide top and a narrow bottom.

Figure 5E:
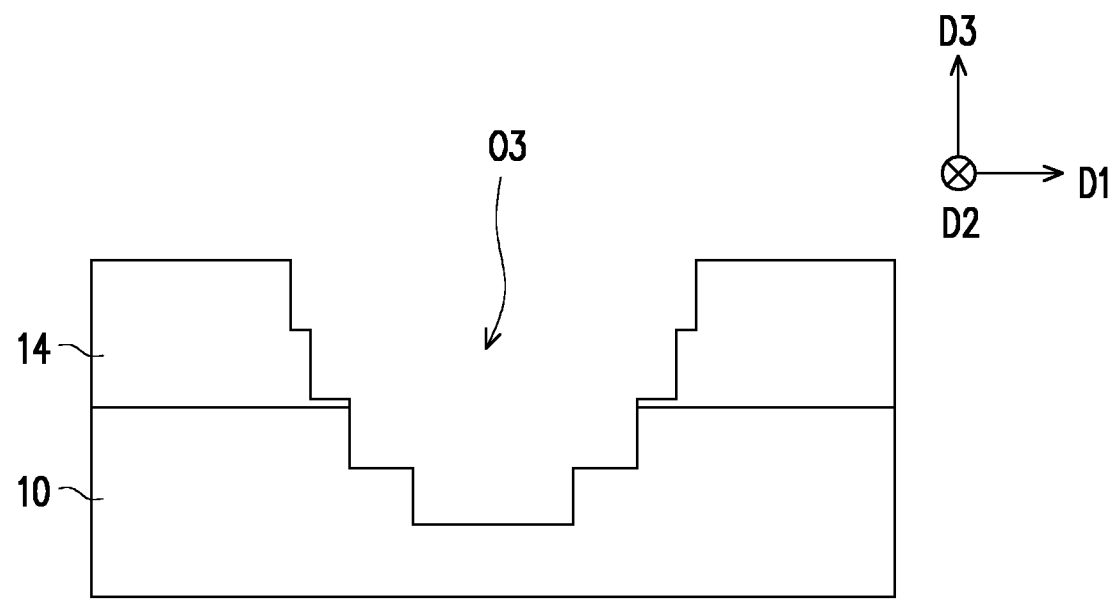

Referring to FIG. 5E, the steps of FIG. 5C and FIG. 5D are then repeated to form an opening O3 that extends from the top of the first dielectric layer 14 into the substrate 10. The opening O3 is wider and deeper than the opening O2. Moreover, the opening O3 is, for example, a stepped opening with a wide top and a narrow bottom. Then, the patterned photoresist layer PR3 is removed.

Figure 5F:
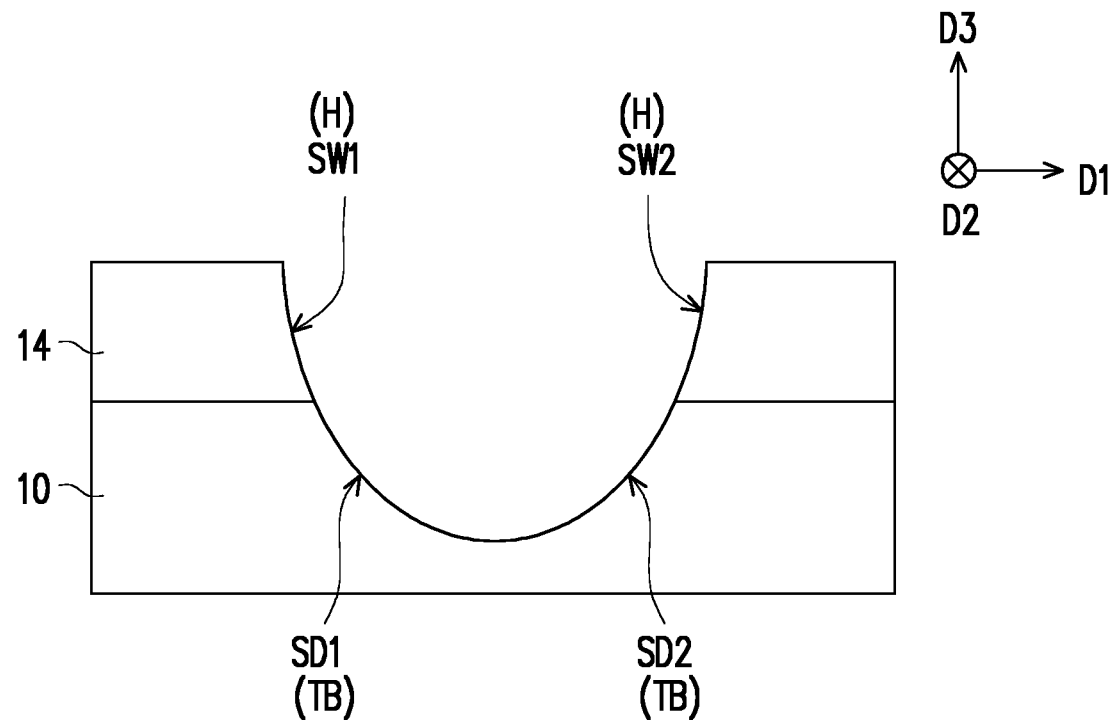

Referring to FIG. 5F, a rounding etch process is performed to form the U-shaped trench TB in the substrate 10 as well as the through hole H in the first dielectric layer 14. In other words, in the embodiments of the U-shaped trench TB, the trench TB and the through hole H are formed by multiple etching steps.

Figure 5G:
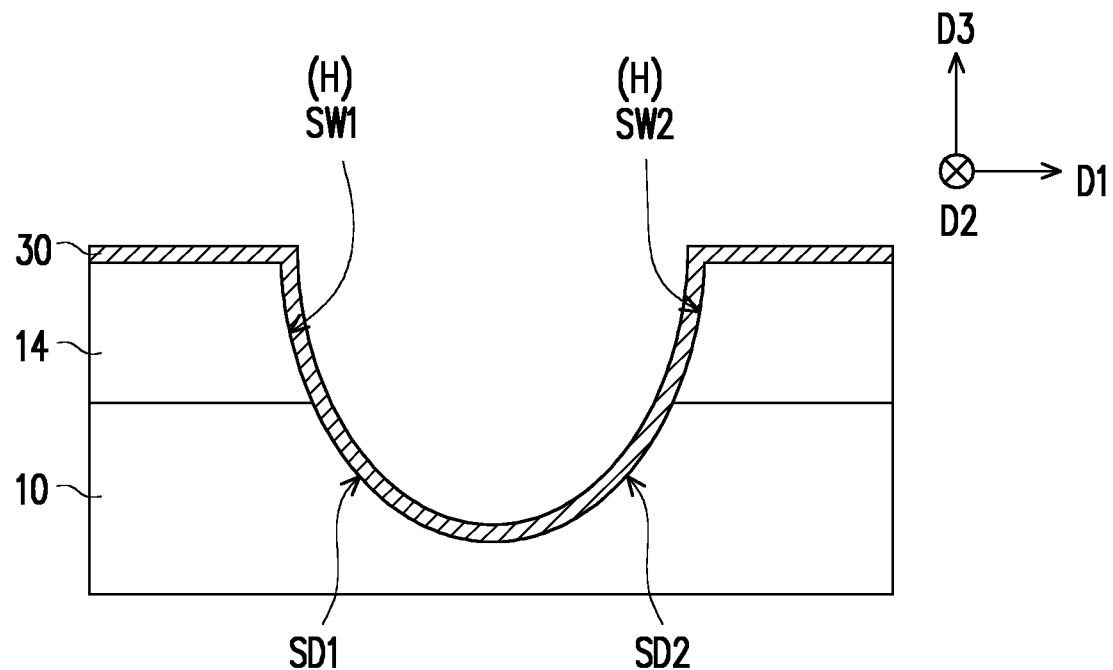
Figure 5H:
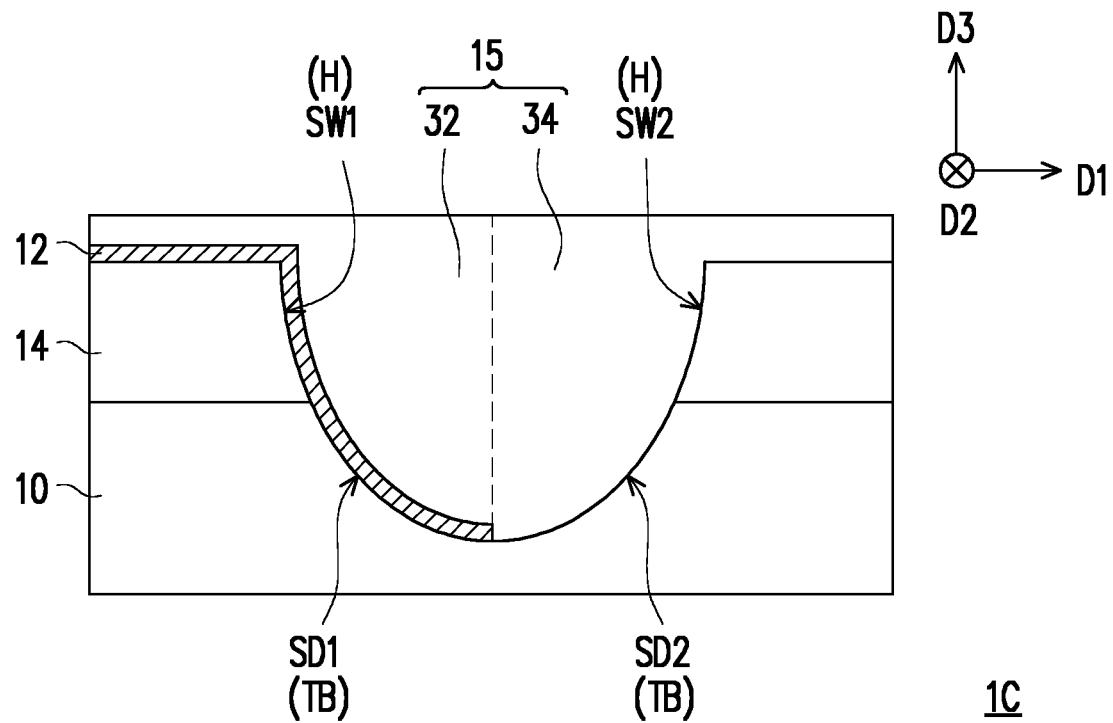

Referring to FIG. 5G and FIG. 5H, the steps described in FIG. 3B to FIG. 3D are then performed to form the reflector 12 and the second dielectric layer 15. Specifically, the reflective layer 30 that covers the trench TB, sidewalls (including the sidewall SW1 and the sidewall SW2) of the through hole H, and the first dielectric layer 14 is formed. Materials of the reflective layer 30 can refer to the materials of the reflector 12 described above, and thus will not be repeated here.

After the reflective layer 30 is formed, the dielectric layer 32 that covers the reflective layer 30 is formed. Materials of the dielectric layer 32 can refer to the materials of the second dielectric layer 15 described above, and thus will not be repeated here. Then, the dielectric layer 32 and the reflective layer 30 are patterned to form the reflector 12. The patterning process may include forming a patterned photoresist layer (not shown) on the dielectric layer 32 by a photolithography process; and removing the dielectric layer 32 exposed by the patterned photoresist layer and a portion of the reflective layer 30 under the removed dielectric layer 32 by an etching process.

After the reflector 12 is formed, another dielectric layer 34 that covers the substrate 10 and the first dielectric layer 14 that are exposed by the reflector 12 is formed. Materials of the another dielectric layer 34 can refer to the materials of the second dielectric layer 15 described above, and thus will not be repeated here. In some embodiments, the materials of the dielectric layer 32 and the another dielectric layer 34 are the same. However, the materials of the dielectric layer 32 and the another dielectric layer 34 may be different.

Then, the dielectric layer 32 and the another dielectric layer 34 are thinned by a grinding process (e.g., a chemical-mechanical planarization process, but not limited thereto) to form the second dielectric layer 15.

In some alternative embodiments, other layers or elements (e.g., the third dielectric layer 16 in FIG. 2, or the layers or elements described above) may be further formed on the second dielectric layer 15.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a device for optical sensing includes a substrate, a photodetector and a reflector. The photodetector is disposed in the substrate. The reflector is disposed in the substrate and spaced apart from the photodetector, wherein the reflector has a reflective surface inclined relative to the photodetector that reflects light transmitted thereto to the photodetector.

In accordance with some embodiments of the disclosure, a device for optical sensing includes a substrate, a photodetector and a reflector. The substrate includes a trench having a first side and a second side opposite to the first side. The photodetector is disposed in the substrate and next to the second side, wherein an arrangement direction of the first side, the second side and the photodetector is perpendicular to a thickness direction of the photodetector. The reflector is disposed on the first side of the trench and exposes a portion of the second side of the trench.

In accordance with some embodiments of the disclosure, a manufacturing method of a device for optical sensing includes the following steps. Forming a photodetector in a substrate. Forming a trench in the substrate, wherein the trench is spaced apart from the photodetector, the trench has a first side and a second side located between the first side and the photodetector, and the first side is inclined relative to the photodetector. Forming a reflector on the first side of the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device for optical sensing, comprising:
a substrate;
a photodetector disposed in the substrate; and
a reflector disposed in the substrate and spaced apart from the photodetector, wherein the reflector has a reflective surface inclined relative to the photodetector that reflects light transmitted thereto to the photodetector,
wherein the substrate comprises a trench spaced apart from the photodetector,
the trench has a first side and a second side located between the first side and the photodetector, the reflector is disposed on the first side, and the reflective surface faces the second side,
wherein the device for optical sensing further comprises:
a first dielectric layer disposed on the substrate and comprising a through hole connected to the trench, wherein the reflector extends onto the first dielectric layer along a partial sidewall of the through hole; and
a second dielectric layer disposed on the reflector and the first dielectric layer.

2. The device for optical sensing as claimed in claim 1, wherein
the substrate is a semiconductor substrate,
the photodetector is a photodiode, and
the device for optical sensing further comprises an isolation element disposed in the substrate and surrounds the photodetector and the reflector.

3. The device for optical sensing as claimed in claim 2, wherein the reflector is spaced apart from the isolation element.

4. The device for optical sensing as claimed in claim 1, wherein the trench is V-shaped or U-shaped.

5. The device for optical sensing as claimed in claim 1, wherein spectral reflectivity of the reflector at wavelength less than 800 nm is larger than or equal to 0.4, and the spectral reflectivity of the reflector at wavelength greater than or equal to 800 nm is larger than or equal to 0.6.

6. The device for optical sensing as claimed in claim 1, wherein an inclination angle θ of the reflective surface satisfies:

$$\tan(2\theta - 90°) \le \frac{TH}{TH \times \cot\theta + 2D}$$

wherein TH is a thickness of the reflector in the substrate, and D is a distance between the photodetector and the reflector.

7. The device for optical sensing as claimed in claim 1, wherein a distance D between the photodetector and the reflector satisfies:

$$D \le W1$$

wherein W1 is a width of the photodetector along an arrangement direction of the photodetector and the reflector.

8. The device for optical sensing as claimed in claim 1, wherein an area AR of the reflective surface satisfies:

$$AR \ge \tfrac{1}{2}(W2 \times W3)$$

wherein W2 is a width of the photodetector along a direction perpendicular to a thickness direction of the photodetector and an arrangement direction of the photodetector and the reflector, and W3 is a width of the photodetector along the thickness direction of the photodetector.

9. A device for optical sensing, comprising:
a substrate comprising a trench having a first side and a second side opposite to the first side;
a photodetector disposed in the substrate and next to the second side, wherein an arrangement direction of the first side, the second side and the photodetector is perpendicular to a thickness direction of the photodetector;
a reflector disposed on the first side of the trench and exposing a portion of the second side of the trench;
a first dielectric layer disposed on the substrate and comprising a through hole connected to the trench, wherein the reflector extends onto the first dielectric layer along a partial sidewall of the through hole; and
a second dielectric layer disposed on the reflector and the first dielectric layer.

10. The device for optical sensing as claimed in claim 9, wherein spectral reflectivity of the reflector at wavelength less than 800 nm is larger than or equal to 0.4, and the spectral reflectivity of the reflector at wavelength equal to or greater than 800 nm is larger than or equal to 0.6.

11. The device for optical sensing as claimed in claim 9, wherein the trench is V-shaped or U-shaped, and an inclination angle θ of the reflective surface satisfies:

$$\tan(2\theta - 90°) \le \frac{TH}{TH \times \cot\theta + 2D}$$

wherein TH is a thickness of the reflector in the substrate, and D is a distance between the photodetector and the reflector.

12. The device for optical sensing as claimed in claim 9, wherein
the substrate is a semiconductor substrate,
the photodetector is a photodiode, and
the device for optical sensing further comprises an isolation element disposed in the substrate and surrounds the photodetector and the reflector.

13. The device for optical sensing as claimed in claim 12, wherein the reflector is spaced apart from the isolation element.

14. A manufacturing method of a device for optical sensing, comprising:
forming a photodetector in a substrate;
forming a trench in the substrate, wherein the trench is spaced apart from the photodetector, the trench has a first side and a second side located between the first side and the photodetector, and the first side is inclined relative to the photodetector;
forming a reflector in the substrate and on the first side of the trench so that the reflector has a reflective surface inclined relative to the photodetector, wherein the reflective surface faces the second side and reflects light transmitted thereto to the photodetector;
forming a first dielectric layer on the substrate prior to forming the trench;
forming a through hole connected to the trench in the first dielectric layer, wherein the reflector is formed after the through hole is formed, and the reflector extends onto the first dielectric layer along a partial sidewall of the through hole; and
forming a second dielectric layer on the reflector and the first dielectric layer.

15. The manufacturing method of the device for optical sensing as claimed in claim 14, wherein an inclination direction of the second side is different from an inclination direction of the first side.

16. The manufacturing method of the device for optical sensing as claimed in claim 14, wherein
the substrate is a semiconductor substrate,
the photodetector is a photodiode, and
the manufacturing method of the device for optical sensing further comprises forming an isolation element in the substrate prior to forming the trench.

17. The manufacturing method of the device for optical sensing as claimed in claim 14, wherein forming the reflector and the second dielectric layer comprises:
forming a reflective layer that covers the trench, sidewalls of the through hole, and the first dielectric layer;
forming a dielectric layer that covers the reflective layer;

patterning the dielectric layer and the reflective layer to form the reflector;

forming another dielectric layer that covers the substrate and the first dielectric layer that are exposed by the reflector; and thinning the dielectric layer and the another dielectric layer to form the second dielectric layer.

18. The manufacturing method of the device for optical sensing as claimed in claim 17, wherein materials of the dielectric layer and the another dielectric layer are the same.

19. The manufacturing method of the device for optical sensing as claimed in claim 13, wherein the trench is a V-shaped trench, and the trench and the through hole are formed by one etching step.

20. The manufacturing method of the device for optical sensing as claimed in claim 13, wherein the trench is a U-shaped trench, and the trench and the through hole are formed by multiple etching steps.

\* \* \* \* \*